United States Patent
Park

(10) Patent No.: US 7,550,350 B2
(45) Date of Patent: Jun. 23, 2009

(54) METHODS OF FORMING FLASH MEMORY DEVICE

(75) Inventor: Byung Soo Park, Icheon-Si (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 133 days.

(21) Appl. No.: 11/770,995

(22) Filed: Jun. 29, 2007

(65) Prior Publication Data
US 2008/0081416 A1    Apr. 3, 2008

(30) Foreign Application Priority Data
Sep. 29, 2006    (KR) ...................... 10-2006-0096219

(51) Int. Cl.
*H01L 21/336*    (2006.01)
(52) U.S. Cl. ........................ 438/258; 438/201; 438/279; 438/597
(58) Field of Classification Search ................. 438/258, 438/201, 279, 597
See application file for complete search history.

(56) References Cited

U.S. PATENT DOCUMENTS

2003/0203605 A1 *    10/2003    Mori et al. ................... 438/586

FOREIGN PATENT DOCUMENTS

| KR | 1019970072090 A | 7/1997 |
|---|---|---|
| KR | 1020030001969 A | 1/2003 |
| KR | 1020030002630 A | 1/2003 |
| KR | 1020040080599 A | 9/2004 |
| KR | 1020050108141 A | 11/2005 |
| KR | 1020060108035 A | 10/2006 |
| KR | 1020070058112 A | 6/2007 |

* cited by examiner

*Primary Examiner*—Jack Chen
(74) *Attorney, Agent, or Firm*—Marshall, Gerstein & Borun LLP

(57) ABSTRACT

The present disclosure relates to methods of forming a flash memory device. A plurality of cells, a plurality of select transistors, and a transistor are formed over a semiconductor substrate including a cell region and a peripheral region. An insulating layer is formed on the entire surface. Metal contact holes are etched and filled with a metal contact layer. Drain contact holes are also etched and filled with a drain contact layer. The order of the metal contact layer formation and drain contact layer formation can be reversed. A single chemical mechanical polishing step is performed to remove the top portions of the metal and drain contact layers, thereby exposing the top surface of the interlayer insulating layer and simultaneously forming both the metal and drain contacts.

5 Claims, 6 Drawing Sheets

METHODS OF FORMING FLASH MEMORY DEVICE

BACKGROUND

1. Field of the Invention

The present invention relates, in general, to a flash memory device and, more particularly, to a method of forming a flash memory device in which the number of process steps can be reduced.

2. Discussion of Related Art

FIGS. 1A to 1D are cross-sectional views illustrating a conventional method of forming a flash memory device.

Referring to FIG. 1A, a plurality of memory cells Cell and select transistors Sel Tr are formed in a cell region of a semiconductor substrate 10 through conventional processes. A transistor Tr is formed in a peripheral region of the semiconductor substrate 10. An insulating layer 11 is formed over the entire surface of the semiconductor substrate 10 including the peripheral and cell regions thereof. A drain contact hole 12 in a drain region between the select transistors Sel Tr is formed by an etch process. The drain contact hole 12 is filled with a polysilicon layer 13a.

Referring to FIG. 1B, a Chemical Mechanical Polishing (CMP) process is performed on the polysilicon layer 13a to expose the top surface of the insulating layer 11. Thus, a drain contact 13 is formed.

Referring to FIG. 1C, an etch process is performed in such a manner that a junction region adjacent to the transistor Tr in the peripheral region is exposed, thus forming metal contact holes 14. A tungsten layer 15a is formed to fill the metal contact holes 14.

Referring to FIG. 1D, a CMP process is performed on the tungsten layer 15a so that the top surface of the insulating layer 11 is exposed. Therefore, the metal contacts 15 are formed.

In the above method, a seam is formed on the top surface of the drain contact 13. The seam is weakened during a cleaning process subsequent to the CMP process performed on the polysilicon layer 13a. Further, during the deposition of the tungsten layer 15a, tungsten infiltrates the seam area, causing a variation in the contact resistance value.

The above method also requires separate etch, deposition, and CMP steps for each of the drain contact 13 in the cell region and the metal contacts 15 in the peripheral region. Further, two CMP processes must be performed even though the final polishing height resulting from the CMP process for forming the drain contact 13 is the same as that of the CMP process for forming the metal contacts 15. Accordingly, the process time is lengthened and the production cost is increased.

SUMMARY OF THE INVENTION

Accordingly, the present disclosure addresses the above problems, and discloses a method of forming a flash memory device in which, when a drain contact of a cell region and a metal contact of a peripheral region are formed, polishing steps are simultaneously performed after contact plugs for the two regions are formed, thereby effectively removing the seams caused by the bowing of the drain contact. Additionally, the number of process steps and the total access time (TAT) can be reduced, thereby reducing manufacturing costs.

According to an aspect of the present disclosure, there is provided a method of forming a flash memory device, including the steps of: forming a plurality of cells, a plurality of select transistors, and a transistor over a semiconductor substrate having a cell region and a peripheral region, wherein the plurality of cells and the plurality of select transistors are formed in the cell region, and the transistor is formed in the peripheral region; forming an insulating layer on the resulting surface; partially etching the insulating layer so that a junction region adjacent to the transistor is exposed, thereby forming first contact holes; depositing a first contact material to fill the first contact holes; partially etching the first contact material and the insulating layer so that a drain region adjacent to the select transistors is exposed, thereby forming a second contact hole; depositing a second contact material to fill the second contact hole; and performing a CMP process to expose a top surface of the insulating layer, thereby forming a first contact and a second contact at the same time.

According to another aspect of the present disclosure, there is provided a method of forming a flash memory device, including the steps of: forming a plurality of cells, a plurality of select transistors, and a transistor over a semiconductor substrate having a cell region and a peripheral region, wherein the plurality of cells and the plurality of select transistors are formed in the cell region, and the transistor is formed in the peripheral region; forming an insulating layer on the resulting surface; partially etching the insulating layer so that a drain region adjacent to the select transistors is exposed, thereby forming first contact holes; depositing a first contact material to fill the first contact holes; partially etching the first contact material and the insulating layer so that a junction region adjacent to the transistor is exposed, thereby forming a second contact hole; depositing a second contact material to fill the second contact hole; and performing a CMP process to expose a top surface of the insulating layer, thereby forming a first contact and a second contact at the same time.

DETAILED DESCRIPTION OF EMBODIMENTS

The following embodiments according to the present disclosure are described with reference to the accompanying drawings.

First Embodiment

Figure 1A:
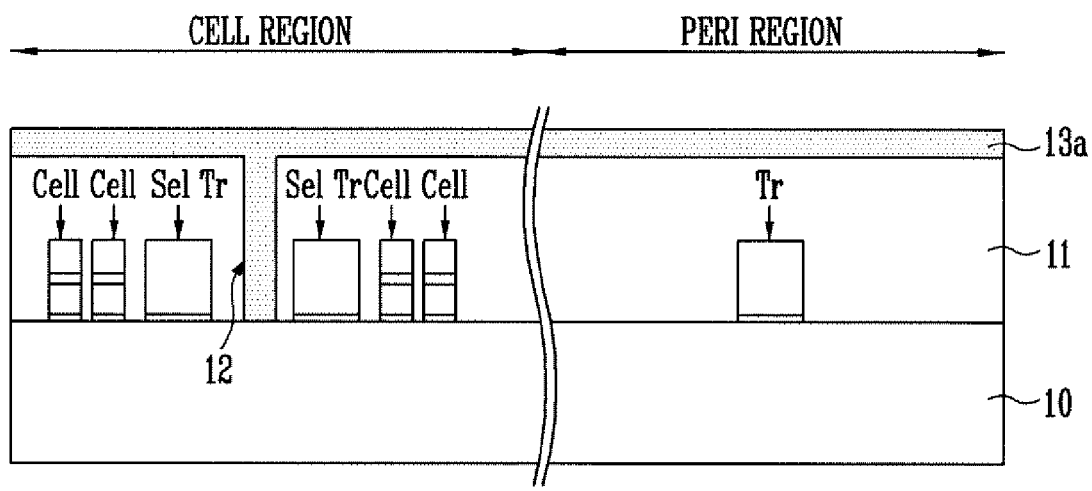
FIGS. 1A to 1D are cross-sectional views illustrating a conventional method of forming a flash memory device.
Figure 1B:
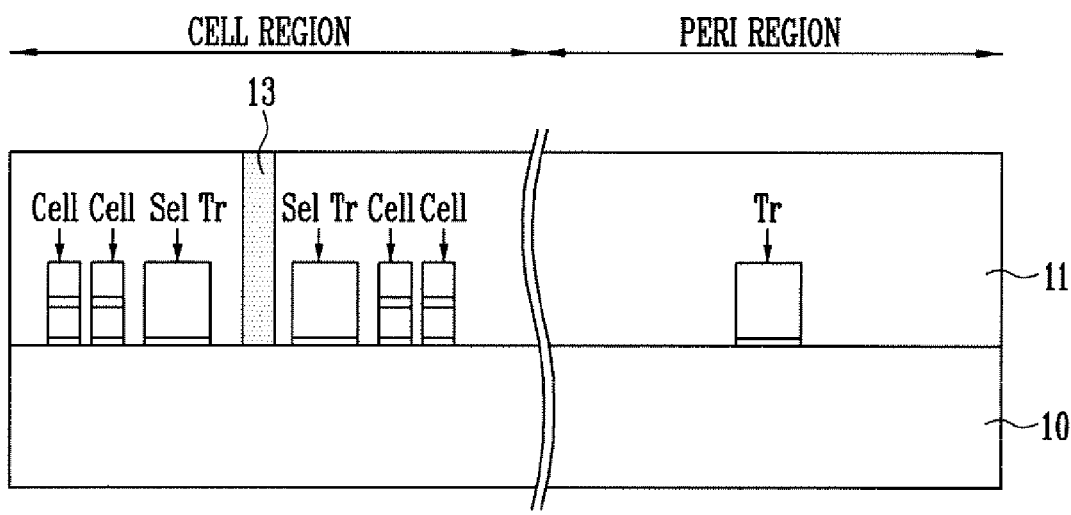
Figure 1C:
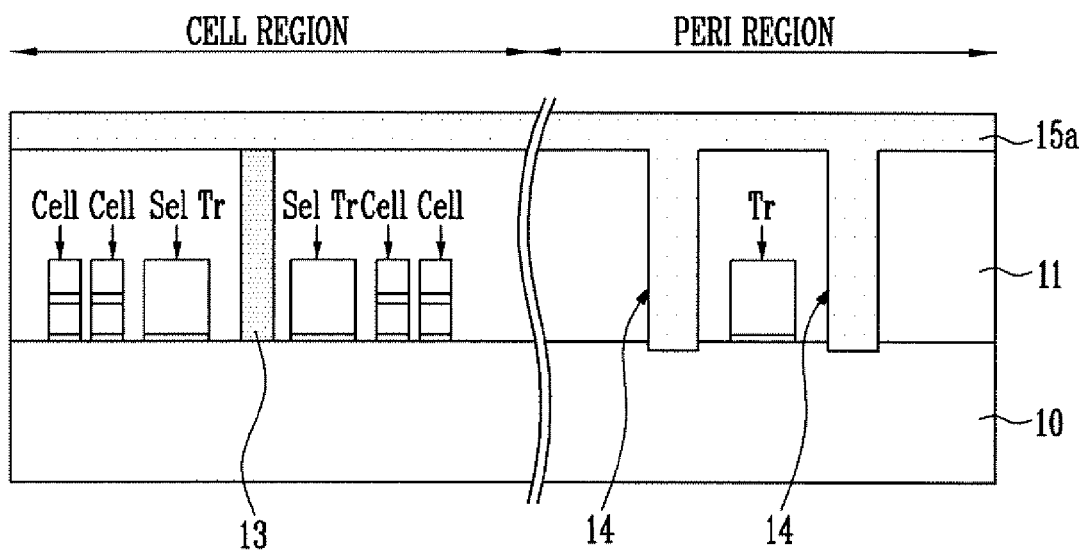
Figure 1D:
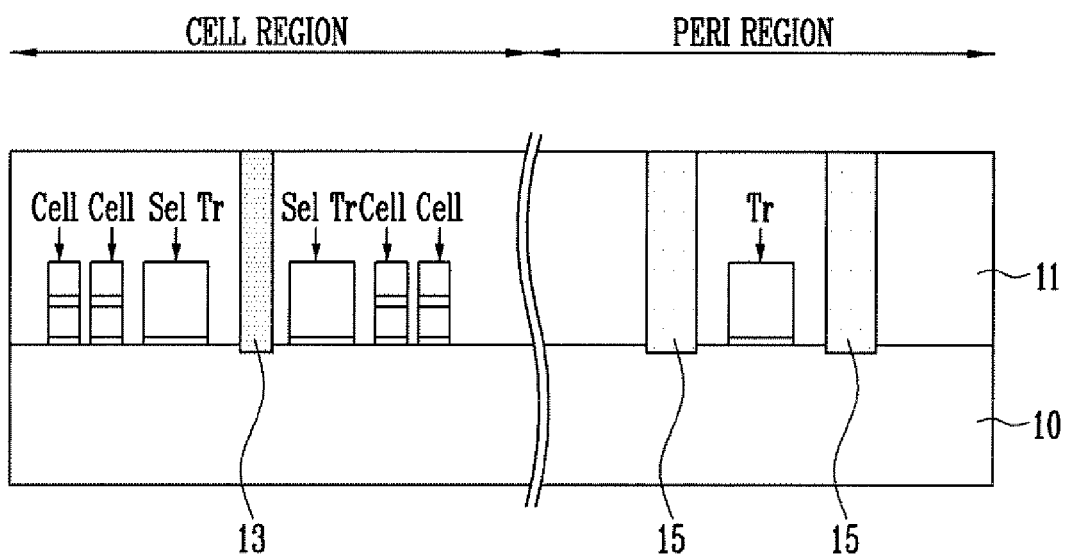
Figure 2A:
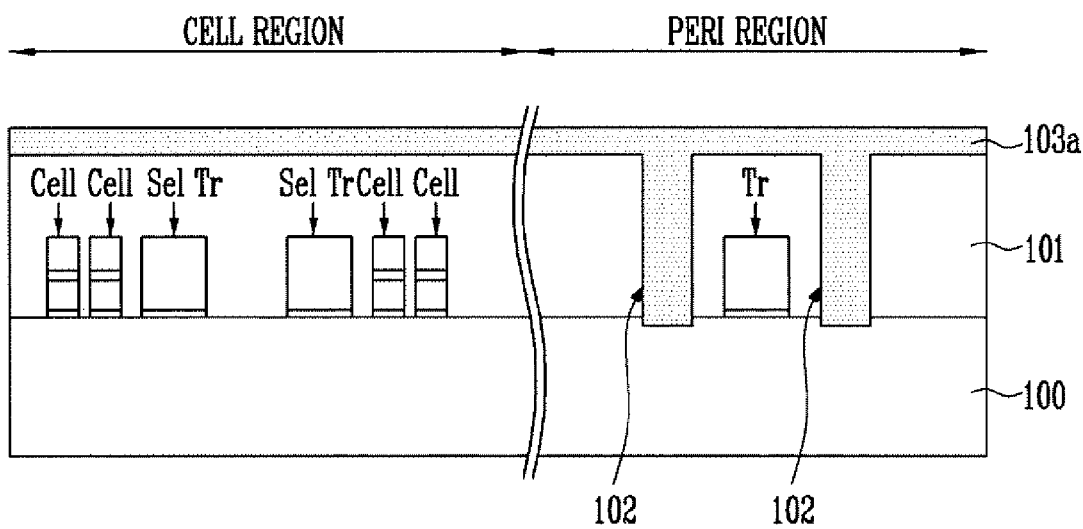
FIGS. 2A to 2D are cross-sectional views illustrating a method of forming a flash memory device according to a first embodiment of the present invention.

2A2DReferring to FIG. 2A, a plurality of memory cells Cell and select transistors Sel Tr is formed in a cell region of a semiconductor substrate 100. In this case, each of the plurality of memory cells Cell has a structure with a tunnel insulating layer, a floating gate, a dielectric layer and a control gate, and select transistors Sel Tr has a structure with the tunnel insulating layer, floating gate and control gate. Furthermore, a transistor Tr is formed in a peripheral region of the semiconductor substrate 100.

An insulating layer 101 is formed over the entire surface including the plurality of memory cells Cell and select transistors Sel Tr, and the transistor Tr.

The insulating layer 101 is etched to expose a junction region adjacent to the transistor Tr of the peripheral region, thereby forming first contact holes 102. Metal layer 103a is deposited to fill the first contact holes 102. Preferably, the metal layer 103a is formed with tungsten.

Figure 2B:
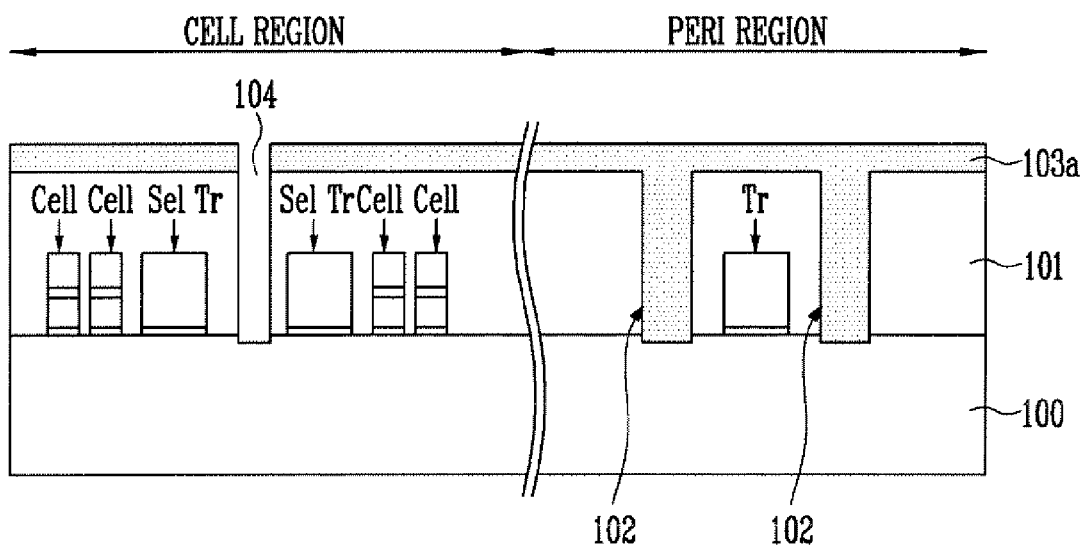

Referring to FIG. 2B, the metal layer 103a and the insulating layer 101 are etched to expose a drain region between the select transistors Sel Tr of the cell region, thereby forming a second contact hole 104.

Figure 2C:
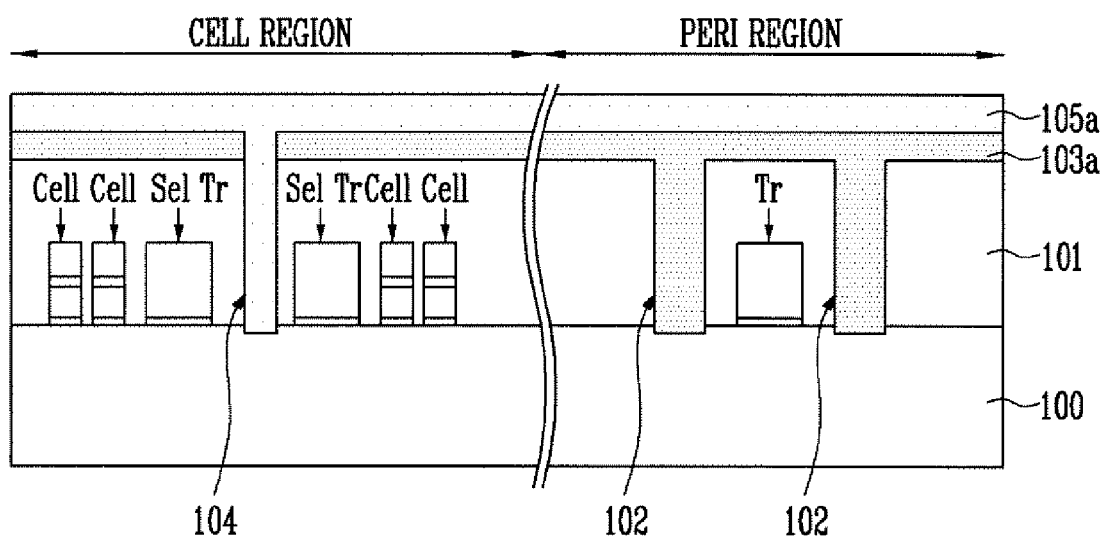

Referring to FIG. 2C, a contact material 105a is deposited to fill the second contact hole 104. Preferably, the contact material 105a is formed with polysilicon. In this case, the height of the second contact hole 104 is increased relative to the prior art due to the additional thickness of the metal layer 103a that is on the top surface of the insulating layer 101. Due to this, formation of the contact material 105a induces bowing on the upper side of the contact hole 104 (i.e., at the top compared with the prior art).

Figure 2D:
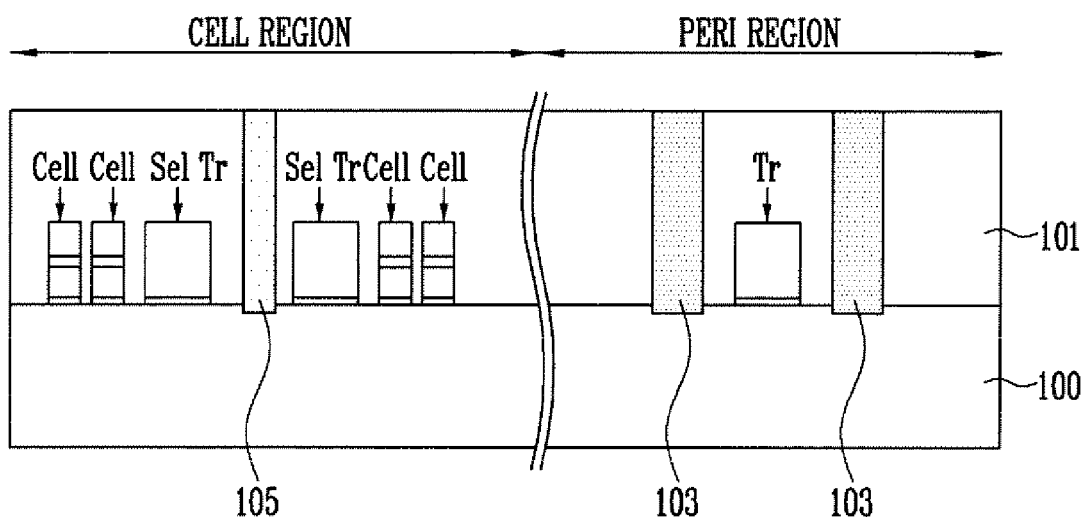

Referring to FIG. 2D, a CMP process is performed to expose the top surface of the insulating layer 101 by removing the top portions of the metal material 103a and the contact material 105a. Thus, metal contacts 103 and a drain contact 105 are formed, respectively. The CMP process is preferably performed using a low selectivity slurry (LSS) having the same polishing rate with respect to all materials. In this case, seams caused by bowing on the top surface of the contact material 105a due to the CMP process are removed.

Furthermore, because the CMP process for forming the metal contact 103 and the drain contact 105 is performed only once, the number of process steps can be reduced relative to the prior art.

Second Embodiment

Figure 3A:
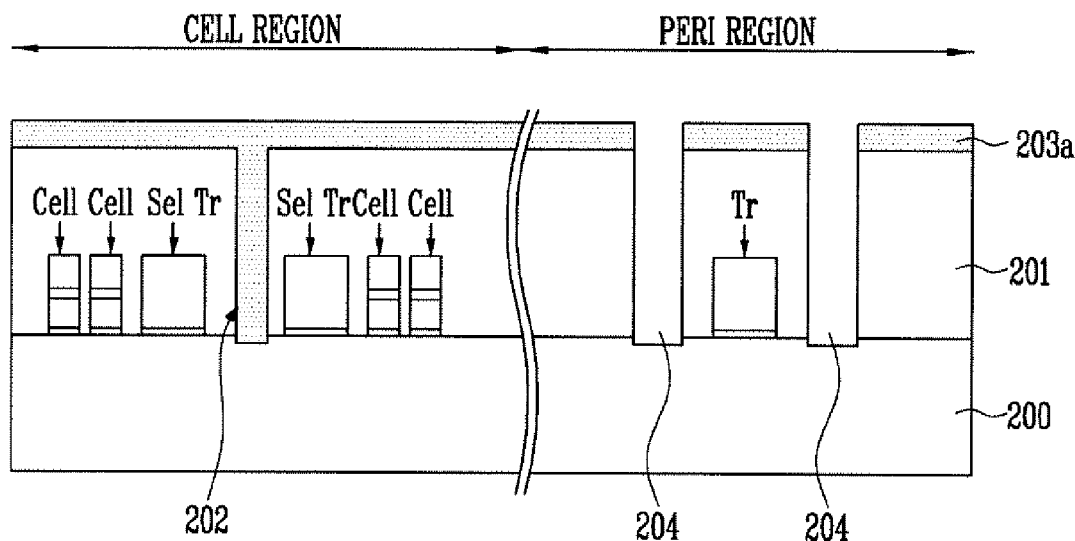
FIGS. 3A to 3C are cross-sectional views illustrating a method of forming a flash memory device according to a second embodiment of the present invention.

3A3CReferring to FIG. 3A, a plurality of memory cells Cell and select transistors Sel Tr is formed in a cell region of a semiconductor substrate 200. Each of the plurality of memory cells Cell has a structure with a tunnel insulating layer, a floating gate, a dielectric layer and a control gate and select transistor Sel Tr has a structure with the tunnel insulating layer, floating gate and the control gate. Furthermore, a transistor Tr is formed in a peripheral region of the semiconductor substrate 200.

An insulating layer 201 is formed over the entire surface including the plurality of memory cells Cell and select transistors Sel Tr, and the transistor Tr.

The insulating layer 201 is etched to expose a drain region between the select transistors Sel Tr of the cell region, thereby forming a first contact hole 202. A contact material 203a is deposited to fill the first contact hole 202. Preferably the contact material 203a is formed with polysilicon.

Thereafter, the contact material layer 203a and the insulating layer 201 are etched to expose a junction region adjacent to the transistor Tr of the peripheral region is exposed, thereby forming second contact holes 204.

Figure 3B:
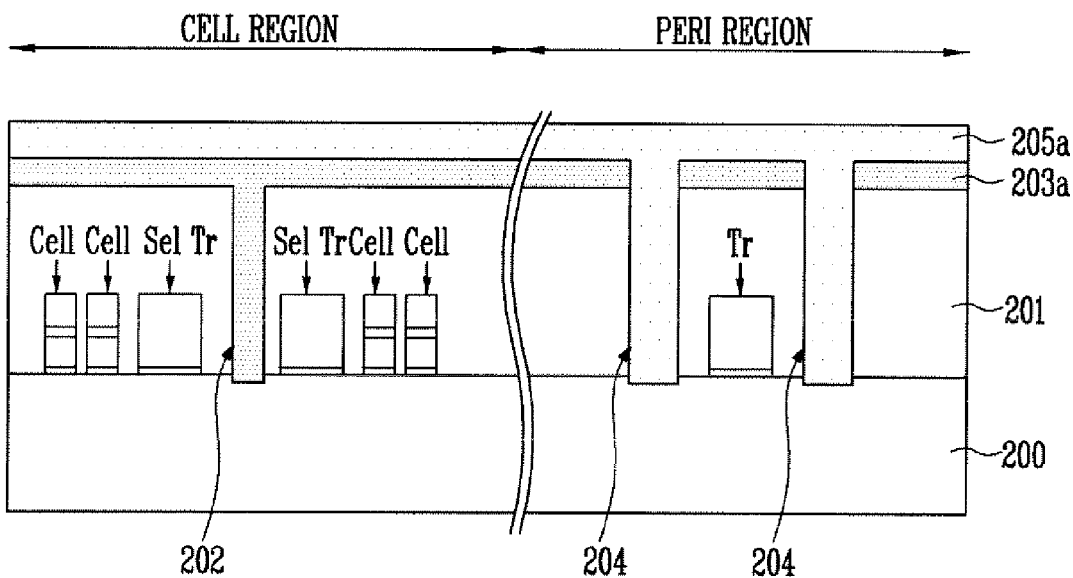

Referring to FIG. 3B, metal material 205a is deposited to completely fill the second contact holes 204. Preferably the metal material 205a is formed with tungsten.

Figure 3C:
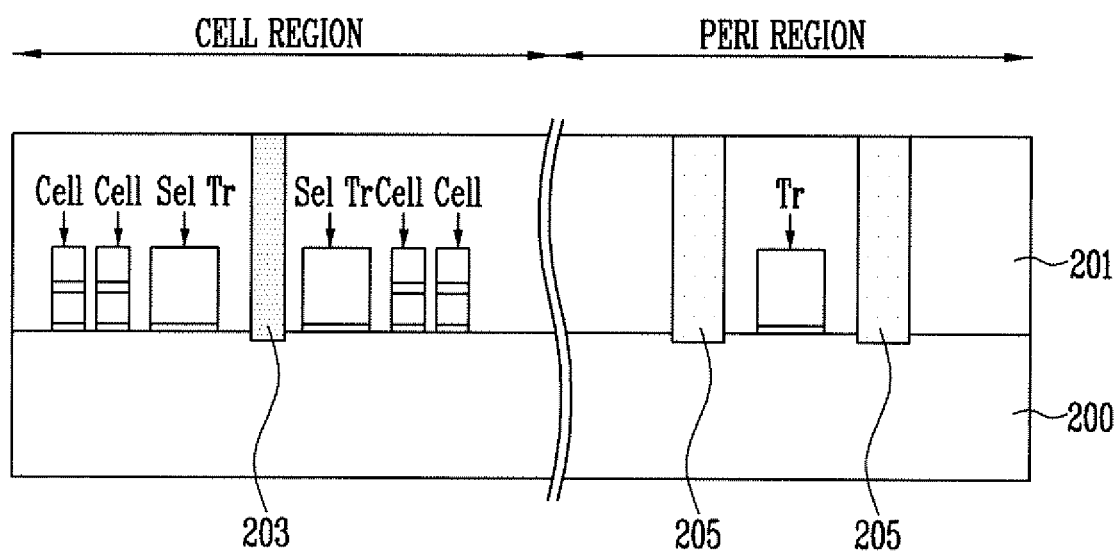

Referring to FIG. 3C, a CMP process is performed to expose the top surface of the insulating layer 201 by removing the top portions of the metal material 205a and contact material 203a. Thus, a drain contact 203 and metal contacts 205 are formed, respectively. The CMP process can be performed using LSS having the same polishing rate with respect to all materials. Because the CMP process for forming the metal contacts 205 and the drain contact 203 is performed only once, the number of process steps can be reduced relative to the prior art.

As described above, in accordance with the first embodiment of the disclosure, in the method of forming the drain contact and the metal contact, after the metal contact hole is formed, the metal material is deposited. The drain contact hole is then formed without an intervening CMP process. After the contact material is deposited, a single CMP process is performed for both the metal and contact materials. Thus, an additional CMP process can be omitted due to the bowing location of the heightened drain contact. Further, because the number of process steps is reduced, the TAT can be reduced and manufacturing costs can be reduced.

In accordance with the second embodiment of the disclosure, in the method of forming the drain contact and the metal contact, the drain contact hole is formed and the contact material is then deposited. The metal contact hole is then formed without an intervening CMP process. After the metal material is deposited, a single CMP process is performed for both the metal and contact materials. Thus, since the number of process steps is reduced, the TAT can be reduced and manufacturing costs can be reduced.

Although the foregoing description has been made with reference to the various embodiments, it is to be understood that changes and modifications of the present disclosure may be made by one with ordinary skilled in the art without departing from the spirit and scope of the present disclosure and appended claims.

What is claimed is:

1. A method of forming a flash memory device, comprising the steps of:

forming a plurality of cells, a plurality of select transistors, and a transistor over a semiconductor substrate having a cell region and a peripheral region, wherein the plurality of cells and the plurality of select transistors are formed in the cell region, and the transistor is formed in the peripheral region;

forming an insulating layer over the plurality of cells, the plurality of select transistors, the transistor and the semiconductor substrate;

etching the insulating layer to expose a junction region adjacent to the transistor, thereby forming first contact holes;

depositing a first contact material to fill the first contact holes;

etching the first contact material and the insulating layer to expose a drain region adjacent to the select transistors, thereby forming a second contact hole;

depositing a second contact material to fill the second contact hole; and performing a Chemical Mechanical Polishing (CMP) process to expose a top surface of the insulating layer, thereby forming a first contact and a second contact.

2. The method of claim 1, wherein, the first contact is a metal contact, and the second contact is a drain contact.

3. The method of claim 1, wherein the first contact material comprises tungsten.

4. The method of claim 1, wherein the second contact material comprises polysilicon.

5. The method of claim 1, wherein the CMP process is performed using a low selectivity slurry (LSS) having the same polishing rate with respect to all materials.

* * * * *